May 13, 1958 R. A. SHUTE 2,834,885

OSCILLATOR CIRCUITS

Filed Dec. 12, 1955 2 Sheets-Sheet 1

Inventor
Ralph A. Shute
By
Holcombe, Wetherill & Brisebois
Attorney

May 13, 1958 R. A. SHUTE 2,834,885

OSCILLATOR CIRCUITS

Filed Dec. 12, 1955 2 Sheets-Sheet 2

Inventor
Ralph A. Shute
By Holcombe, Wetherill & Brisebois
Attorney 2,834,885

OSCILLATOR CIRCUITS

Ralph Ashley Shute, Cambridge, England, assignor to Pye Limited, Cambridge, England, a British company Application December 12, 1955, Serial No. 552,592

Claims priority, application Great Britain December 24, 1954

9 Claims. (Cl. 250—36)

The present invention relates to oscillator circuits suitable for use as timebases oscillators associated with cathode ray tubes, and intended for operation with automatic frequency control circuits which produce a voltage controlling the frequency of the oscillator. Such arrangements are employed in flywheel synchronising circuits in television receivers.

It is an object of the present invention to provide an oscillator circuit of which the frequency of operation remains substantially stable within given limits with variations in the high tension supply such as are likely to occur during the working of the oscillator by reasons of fluctuations in the main supply and/or in the components supplying the high tension voltage, whereby the oscillator frequency remains within the pull-in range of an associated automatic frequency control circuit.

According to the present invention, an oscillator circuit comprises at least one electronic valve producing an output containing a pulse component capable of charging or discharging a condenser in order to form a sawtooth waveform and a rectifying device is connected to a grid circuit of the valve or of one of the valves and is biased by a voltage stabilising device so as to clamp the oscillator waveform appearing at that grid to a desired level, and thereby maintain the frequency of the oscillator substantially stable within given limits when variations occur in the high tension supply.

The oscillator circuit may comprise an assymetrical multivibrator consisting of two interconnected electronic valves having a common cathode circuit. In one form of the invention the two valves are respectively a triode and a pentode, and the rectifying device is connected in the grid circuit of the pentode and is biased negatively by means of a voltage stabilising device connected in the common cathode circuit of the valves. Alternatively the oscillator circuit may operate as a blocking oscillator.

The voltage stabilising device may for example comprise a silicon carbide resistor, such as that known under the registered trademark "Metrosil," a selenium rectifier working on the back conduction, or a Gautrat voltage stabiliser.

In order that the invention may be more fully understood reference will now be made to the accompanying drawings in which.

Figure 1:
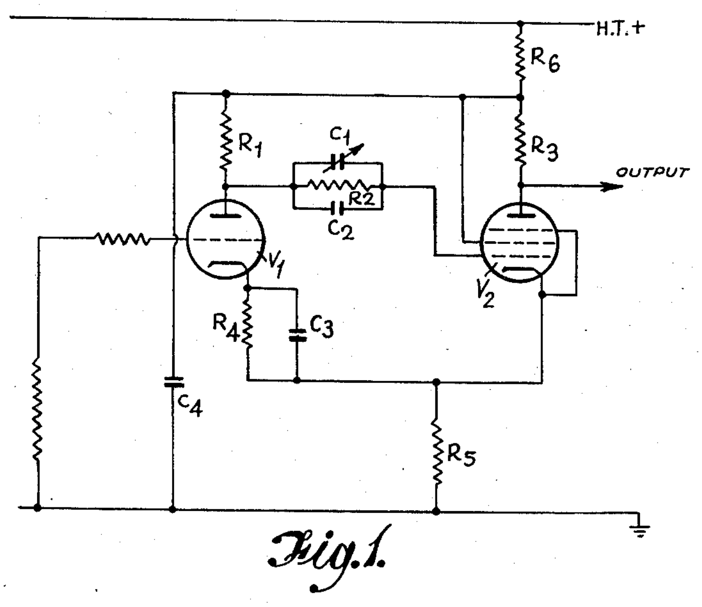
Figure 1 is a basic circuit diagram of a known type of assymetrical multivibrator.

Figure 1 shows a basic form of assymetrical multivibrator which is intended to be controlled by an automatic frequency control circuit and comprising a triode V1 and a pentode V2. The frequency of oscillation of this circuit is determined by the values of resistors R1 and R2, condensers C1 and C2 and the grid to cathode voltage of valve V2. Resistor R4 and condenser C3 provide cathode bias to triode V1 and resistor R5 forms a common cathode coupling resistance between valves V1 and V2. This latter resistor must be large enough to cut off V1 and V2 on the maximum current pulse. Resistor R3 is the anode load for pentode V2 and is connected to the high tension positive supply, together with resistor R1 forming the anode load of triode V1, through resistor R6. A decoupling condenser C4 is connected at the junction of resistor R6 with resistors R1 and R3. In order to vary the frequency of the oscillator, it is desirable to apply a D. C. voltage to the grid of one of the valves. The slope of the voltage/frequency characteristic should be greater than 300 C. P. S./volt in order to obtain the desired pull-in with the automatic frequency control circuit.

The operation of the circuit is as follows: Assuming an agitation to occur such that V1 is conducting, then its anode voltage drops and the voltage at the grid of V2 drops, hence the voltage across R5 drops making V1 conduct harder. This continues until the anode voltage of V1 reaches a value determined by the cathode bias circuit R4, C3 and thea node load R1. The condensers C1 and C2 now start to discharge so that the control grid voltage of V2 rises until cut-off of V2 is reached. V2 now conducts and its anode current rises and the voltage across resistor R5 also rises, lowering the anode current of V1. This happens rapidly until valve V1 is cut-off and its anode voltage reaches H. T. potential. The voltage developed across R5 is insufficient to cut-off triode V1 hence the anode current commences to rise again and the cycle is repeated. The voltage on the grid of pentode V2 takes the form shown in Figure 2.

Figure 2:
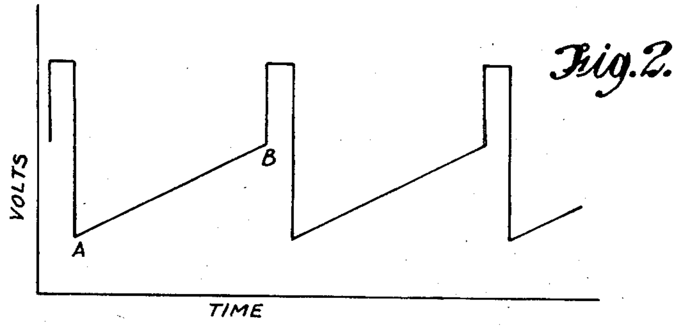
Figures 2 and 3 are explanatory waveforms.
Figure 3:
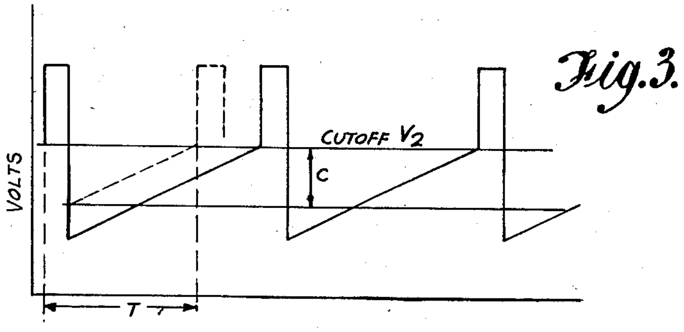

Assuming that a frequency change is due to an alteration in the time constant, then the slope of A—B in Figure 2 varies. If however the size of the pulse injected varies then the frequency will also change as shown in Figure 3. This state of affairs occurs when the H. T. is varied as will now be explained.

Referring to Figure 1, as the H. T. voltage drops, the current taken by both valves drops and in triode V1 the bias voltage is reduced as well as the coupling voltage across R5. Since the compensation due to reduction of bias voltage is not 100% then the height of the current pulse produced at the anode of V1 is less and hence condensers C1 and C2 take less time to reach cut-off and the frequency increases. The current pulse in pentode V2 also decreases and this lowers the coupled cathode voltage across R5 which in turn makes the cut-off less severe and limits the voltage swing across R1. This action also raises the frequency of the oscillator and it will thus be seen that the general tendency is to increase frequency with a decrease of H. T. voltage.

Figure 4:
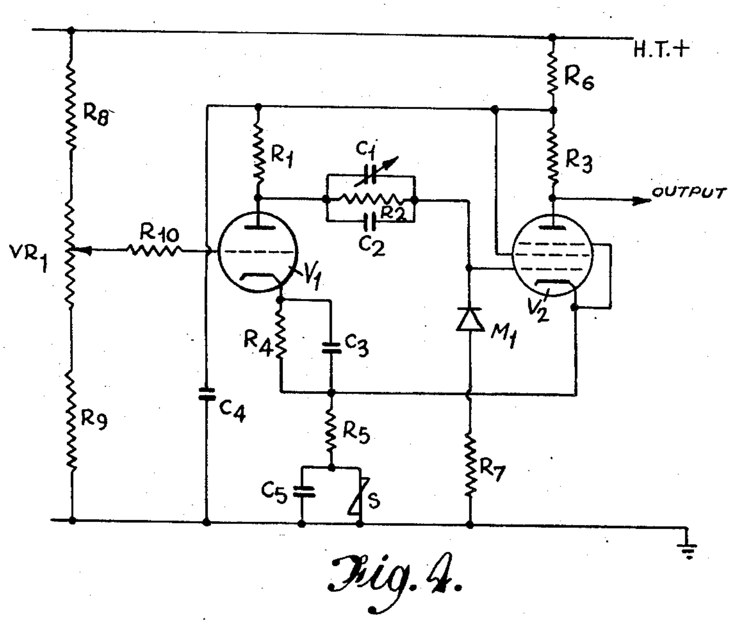
Figure 4 shows the assymetrical multivibrator of Figure 1 modified according to the present invention.

Figure 4 shows the oscillator circuit of Figure 1 modified according to the present invention and having a rectifying device M1 connected to the grid of the pentode V2 in series with resistor R7 and a voltage stabilising device having a non-linear voltage/current characteristic and shown as a silicon carbide resistor S, such as that known under the registered trademark "Metrosil," connected in series with the coupling resistor R5 and shunted by a condenser C5. The action of these additional components is to chop the waveform at the grid of V2 at the desired point so fixing the voltage variation C in Figure 3, whereby the oscillator frequency remains substantially stable with H. T. variations. For example the oscillator frequency will not change by more than one or two percent with a ten percent change in high tension voltage.

Resistors R8, R9 and VR1 connected across the high tension supply provide the grid voltage for valve V1 which varies with high tension voltage. Potentiometer VR1 forms a frequency control and where the circuit arrangement according to the present invention is employed as the line timebase oscillator in a television receiver, potentiometer VR1 serves as the line hold control. Resistor R10 is a grid stopper limiting the grid current flow in V1. Resistor R7 is required in series with the rectifying device M1 since if this device is connected to earth its effect on frequency is so pronounced as to effect a reversal of the H. T. drift. With resistor R7 included in series with the rectifying device M1 this effect is counteracted and a negligible H. T. drift is obtained. The voltage stabilising resistor S and condenser C5 provide a steady D. C. voltage relatively independent of current which biases the rectifying device M1. In addition resistor R3 must be large enough to provide the necessary output voltage.

Figure 5:
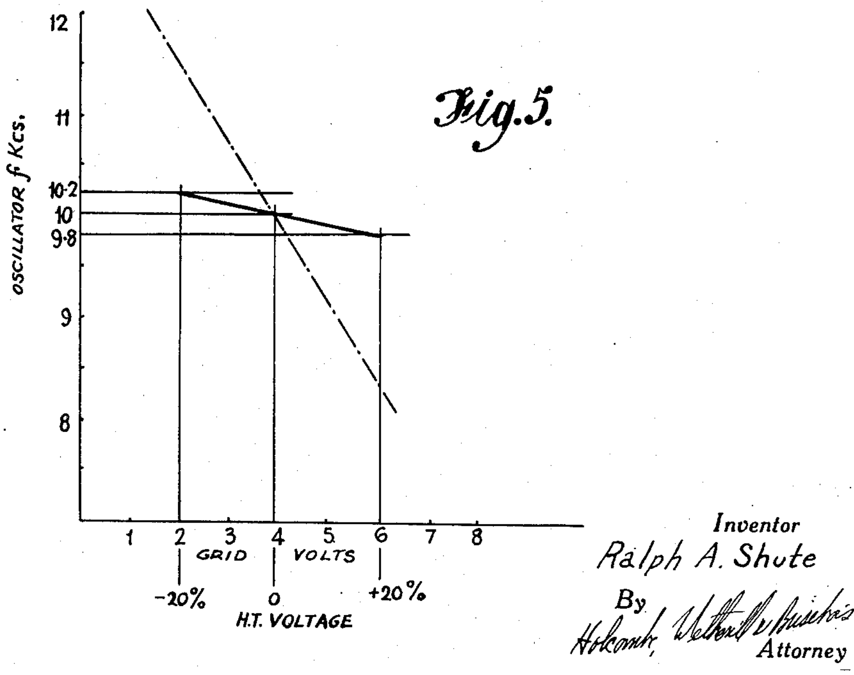
Figure 5 is a further explanatory waveform relating to the circuit of Figure 4.

Hence, use is made of the dynamic resistance of the Metrosil which is about 120 ohms and the D. C. resistance of about 600 ohms. The H. T. drift is reduced even further to a few cycles whilst the control voltage curve is destroyed to a large extent. The resulting properties of the circuit are as shown in Figure 5, in which the full line curve illustrates change in frequency with change in high tension voltage. It will be noticed that the oscillator frequency only changes by two percent with a twenty percent change in high tension voltage whereby its frequency is maintained within the pull-in range of the automatic frequency control circuit. The chain line curve shows the change in oscillator frequency with change in grid voltage produced by varying potentiometer VR1 which is employed to set the oscillator frequency.

Whilst a particular embodiment has been described it will be understood that various modifications may be made without departing from the scope of the invention. For example any other form of voltage stabilising device may be used, such as selenium rectifier working on the back conduction, or a Gautrat voltage stabiliser. In another modification resistor R5 and condenser C5 may be omitted. Furthermore the invention may also be applied to a blocking oscillator as well as to a multi-vibrator circuit.

I claim:

1. An oscillator circuit, particularly for use as a time base oscillator, comprising at least one electronic valve, a high tension supply for said valve, a condenser connected to an electrode of said valve, the action of said valve charging and discharging said condenser in order to form a sawtooth waveform, a rectifying device connected to a grid electrode of said valve, a resistor connected in series with said rectifying device and a voltage stabilising device having a non-linear voltage/current characteristic connected to bias said rectifying device in order to clamp the oscillator waveform appearing at said grid electrode to a level set by said stabilising device, and thereby maintain the frequency of the oscillator substantially constant within given limits, when variations occur in the high tension supply.

2. An oscillator circuit particularly for use as a time base oscillator comprising at least one electronic valve, a high tension supply for said valve, a condenser connected to an electrode of said valve, the action of said valve charging and discharging said condenser in order to form a sawtooth waveform, a rectifying device connected to a grid electrode of said valve, a resistor connected in series with said rectifying device and a voltage stabilising device comprising a silicon-carbide resistor having a non-linear voltage/current characteristic connected to bias said rectifying device in order to clamp the oscillator waveform appearing at said grid electrode to a level set by said stabilising device, and thereby maintain the frequency of the oscillator substantially constant within given limits when variations occur in the high tension supply, a resistor connected in series with said silicon-carbide resistor, and a condenser connected across said silicon-carbide resistor.

3. An oscillator particularly for use as a time base oscillator, comprising an assymetrical multivibrator consisting of a first electronic valve and a second electronic valve, a high tension supply for said valves, a condenser connected between the anode of said first valve and the control grid of said second valve, the action of said valves charging and discharging said condenser in order to form a sawtooth waveform, an anode load for said first valve, a further anode load for said second valve, a rectifying device connected to the grid of said second valve, a resistor connected in series with said rectifying device, and a common cathode circuit to said first and second valves including a voltage stabilising device having a non-linear voltage/current characteristic, in order to clamp the waveform appearing at the grid of said second valve at a constant level and maintain the frequency of the oscillator substantially constant despite variations in the high tension supply.

4. An oscillator as claimed in claim 3, in which the voltage stabilising device comprises a silicon-carbide resistor.

5. An oscillator as claimed in claim 3, in which the voltage stabilising device comprises a selenium rectifier working on its back conductor.

6. An oscillator particularly for use as a time base oscillator, comprising an assymetrical multivibrator consisting of a first triode valve and a second pentode valve, a high tension supply for said valves, a condenser connected between the anode of said triode valve and the control grid of said pentode valve, the action of said valves charging and discharging said condenser in order to form a sawtooth waveform, an anode load for said first valve, a further anode load for said pentode valve and an output connection from the anode of said pentode valve, a rectifying device connected to the grid of said pentode valve, a resistor connected in series with said rectifying device and a common cathode circuit to said triode and pentode valves including a voltage stabilising device having a non-linear voltage/current characteristic, in order to clamp the waveform appearing at the grid of said pentode valve at a constant level and maintain the frequency of the oscillator substantially constant despite variations in the high tension supply, a condenser connected across said voltage stabilising device and a resistor connected in series with said voltage stabilising device.

7. An oscillator particularly for use as a time base oscillator, comprising an assymetrical multivibrator consisting of a first triode valve and a second pentode valve, a high tension supply for said valves, a condenser connected between the anode of said triode valve and the control grid of said pentode valve, the action of said valves charging and discharging said condenser in order to form a sawtooth waveform, an anode load for said triode valve, a further anode load for said pentode valve, a rectifying device connected to the grid of said pentode valve, a resistor connected in series with said rectifying device, a common cathode circuit to said triode and pentode valves including a voltage stabilising device having a non-linear voltage/current characteristic in order to clamp the waveform appearing at the grid of said second valve to a constant level set by said stabilising device and thereby maintain the frequency of the oscillator substantially constant within given limits despite variations in the high tension supply, a condenser connected across said voltage stabilising device, a potentiometer network connected across said high tension supply, and an adjustable tapping on said potentiometer network connected to the grid of the first triode valve.

8. An oscillator as claimed in claim 7, in which the voltage stabilising device comprises a silicon-carbide resistor.

9. An oscillator particularly for use as a time base oscillator, comprising an assymetrical multivibrator consisting of a first electronic valve and a second electronic valve, a high tension supply for said valves, a condenser connected between the anode of said first valve and the control grid of said second valve, the action of said valves charging and discharging said condenser in order to form a sawtooth waveform, an anode load for said first valve, a further anode load for said second valve, a rectifying device connected to the grid of said second valve, a resistor connected in series with said rectifying device, a common cathode circuit to said first and second valves including a voltage stabilising device having a non-linear voltage/current characteristic in order to clamp the waveform appearing at the grid of said second valve to a constant level set by said stabilising device and thereby maintain the frequency of the oscillator substantially constant within given limits despite variations in the high tension supply, a condenser connected across said voltage stabilising device, a resistor in series with said voltage stabilising device, a potentiometer network connected across said high tension supply, and an adjustable tapping on said potentiometer network connected to the grid of the first triode valve.

References Cited in the file of this patent

UNITED STATES PATENTS

| | | |
|---|---|---|
| 2,159,792 | Geiger | May 23, 1939 |
| 2,207,511 | Geiger | July 9, 1940 |
| 2,583,649 | Hewlett | Jan. 29, 1952 |
| 2,683,806 | Moody | July 13, 1954 |